United States Patent [19]

Guhn

[11] Patent Number: 4,473,805
[45] Date of Patent: Sep. 25, 1984

[54] PHASE LOCK LOSS DETECTOR

[75] Inventor: Dewayne K. Guhn, Mount Holly, N.J.

[73] Assignee: RCA Corporation, New York, N.Y.

[21] Appl. No.: 330,387

[22] Filed: Dec. 14, 1981

[51] Int. Cl.³ .................. H03L 7/06; H03K 5/153; G01R 29/027
[52] U.S. Cl. .................. 331/1 A; 307/511; 307/526; 307/527; 307/234; 328/134; 332/16 R
[58] Field of Search .............. 307/510, 511, 514, 516, 307/525, 526, 527, 529, 234, 471; 328/133, 134; 331/1 A, 2; 332/16 R

[56] References Cited

U.S. PATENT DOCUMENTS

| | | |
|---|---|---|
| 3,080,533 | 1/1959 | Edwards . |
| 3,456,196 | 7/1969 | Schneider . |
| 3,509,475 | 4/1970 | Webb .................................. 328/133 |
| 3,652,943 | 3/1972 | Piccirilli et al. .................... 307/234 |
| 3,715,751 | 2/1973 | Mead . |
| 3,988,696 | 10/1976 | Sharpe . |
| 4,087,628 | 5/1978 | Sanders et al. . |
| 4,122,405 | 10/1978 | Tietz et al. . |
| 4,128,812 | 12/1978 | Paulis ................................. 328/134 |
| 4,151,463 | 4/1979 | Kibler . |
| 4,233,525 | 11/1980 | Takahashi et al. ................... 307/234 |
| 4,246,497 | 1/1981 | Lawson et al. ...................... 328/133 |
| 4,267,514 | 5/1981 | Kimsey ............................... 328/133 |

Primary Examiner—John Zazworsky
Attorney, Agent, or Firm—J. S. Tripoli; R. L. Troike; D. W. Phillion

[57] ABSTRACT

A system for detecting phase lock loss between first and second two level signals $S_N$ and $S_R$, and comprising an Exclusive OR (XOR) gate having first and second input terminals and an output terminal, logic for supplying $S_N$ and $S_R$ to the first and second inputs of the XOR gate so that the center points of the respective upper and lower levels are aligned and with the time intervals between adjacent leading and trailing edges of $S_N$ and $S_R$ being nominally equal to $\Delta t$. Also provided is an AND gate having first and second input terminals and an output terminal, and delay logic for supplying the output signal of the XOR gate to the two input terminals of the AND gate with such output signal arriving at one of the input terminals of the AND gate a time interval $\Delta t$ after the arrival of the output signal at the other input terminal of the AND gate and a detector for detecting an output signal from the AND gate to indicate loss of phase lock.

4 Claims, 3 Drawing Figures

PHASE LOCK LOSS DETECTOR

The U.S. Government has rights in this invention under sub-contract MIT/LL PO # Bx-435 pursuant to Government Contract u/F19628-80-C-0002 awarded by the Department of the Air Force.

This invention relates generally to digital frequency synthesizers and more particularly to a phase locked loop detector for determining when the phase of one signal, such as that generated by a voltage-controlled oscillator (VCO) is shifted with respect to the phase of a reference frequency signal by a predetermined amount.

There are many applications where it is desired to phase lock one signal with respect to a reference signal. Such systems are generally known as phase locked loop systems and employ a VCO which supplies a divided down output signal to one input of a phase detector. A reference signal is supplied to the other input of the phase detector and the output of the phase detector is supplied back to the frequency control input of the VCO to adjust its frequency so that the divided down frequency is phase locked with the phase of the reference signal. In many applications of this type circuit, it is desirable to know when phase lock between the two signals has been lost so that it can be reset by automatic means or, by a human operator who can intervene to remedy the failure.

There are many known phase lock loss detectors in the prior art. Many of these phase loss detector circuits are relatively complex and employ considerable logic. Some of them are adapted only to detecting phase lock loss where the two signals whose phase are being compared have the same duty cycle, usually 50%. Others are adapted to detect phase lock loss from duty cycles which are different.

The present invention provides a simple and inexpensive phase lock loss detector circuit which detects phase lock loss between two signals having either the same duty cycles or different duty cycles.

In accordance with a preferred form of the invention there is provided a system for detecting phase lock loss between first and second two level signals $S_N$ and $S_R$, and comprising an Exclusive OR (XOR) gate having first and second input terminals and an output terminal, for outputting a signal when the levels of the signals supplied to its first and input terminals are unequal, logic for supplying $S_N$ and $S_R$ to the first and second inputs of the XOR gate so that the center points of the respective upper and lower levels are aligned and with the time intervals between adjacent leading and trailing edges of $S_N$ and $S_R$ being nominally equal to $\delta$. Also provided is an AND gate having first and second input terminals and an output terminal, and delay logic for supplying the output signal of the XOR gate to the two input terminals of the AND gate with such output signal arriving at one of the input terminals of the AND gate a time interval $\Delta$ after the arrival of the output signal at the other input terminal of the AND gate and a detector for detecting an output signal from the AND gate to indicate loss of phase lock.

Figure 1:
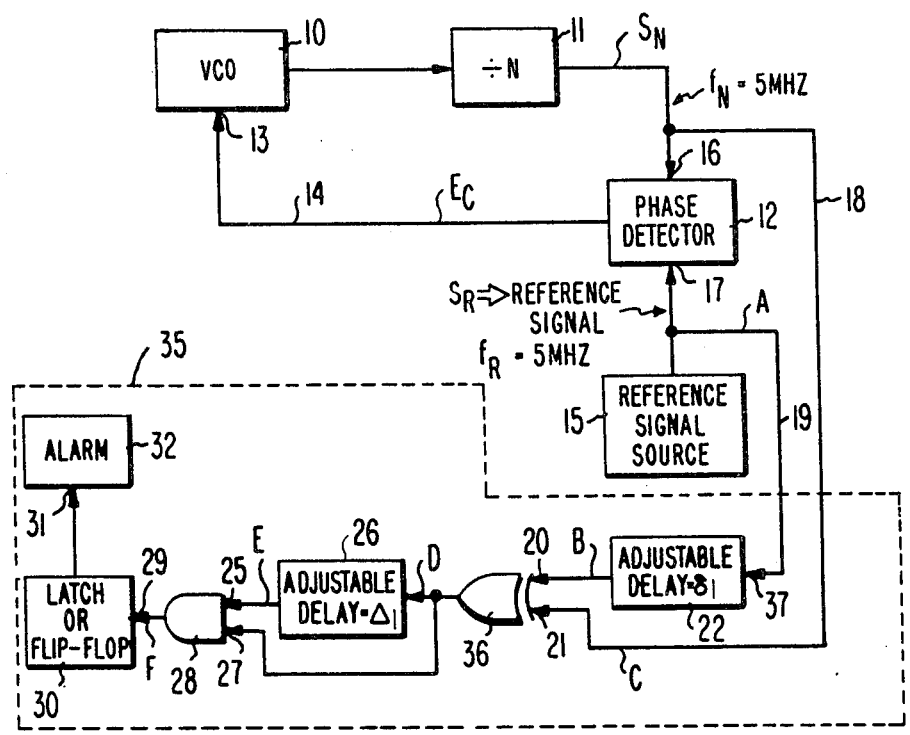
FIG. 1 is a block diagram of the invention.

Referring now to FIG. 1, there is shown a typical system in which the invention is employed. The overall system is a phase locked loop including a VCO 10 which supplies an output signal to a divider 11. The frequency divided signal, arbitrarily defined (after phase lock), to be 5 MHz, is supplied to one input 16 of phase detector 12. A reference signal is generated in reference signal source 15 and also has a frequency of 5 MHz. The phase detector 12 responds to the two signals supplied to the two inputs 16 and 17 thereof to supply a control voltage $E_c$ back to the frequency control input 13 of VCO 10 via lead 14.

The invention consists of the logic within the dashed block 35 which will be discussed first with the waveforms A-F of FIG. 2 and subsequently with the waveforms A-E of FIG. 3. For purposes of brevity, the waveforms of FIGS. 2 and 3 will be referred to herein as waveform 2A, 2B or waveform 3A, 3B, etc. rather than as waveform A of FIG. 2 or as waveform A of FIG. 3.

Figure 2:
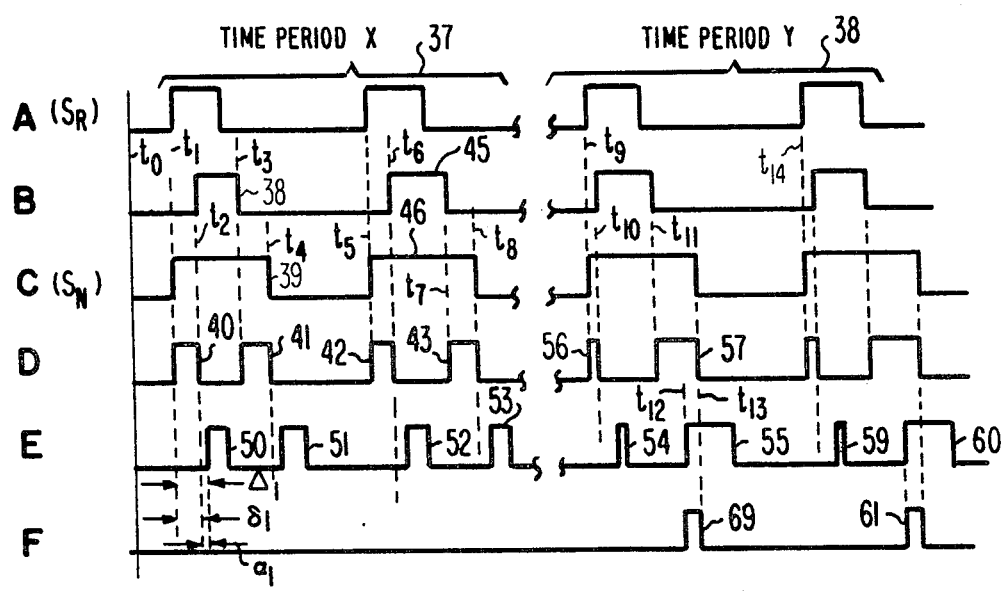
FIG. 2 is a set of waveforms illustrating the operation of the circuit when the duty cycle of the two signals being phase locked are different.

The waveforms of FIG. 2 represent a first mode of operation in which the duty cycles of signals ($S_N$) from the divider and signals ($S_R$) from reference source 15 are different. More specifically, the duty cycle of $S_R$ has been selected to be 25%, i.e., the high level as shown in waveform 2A occurs during 25% of the time and the lower level 75% of the time. The duty cycle of $S_N$ is 50%.

Figure 3:
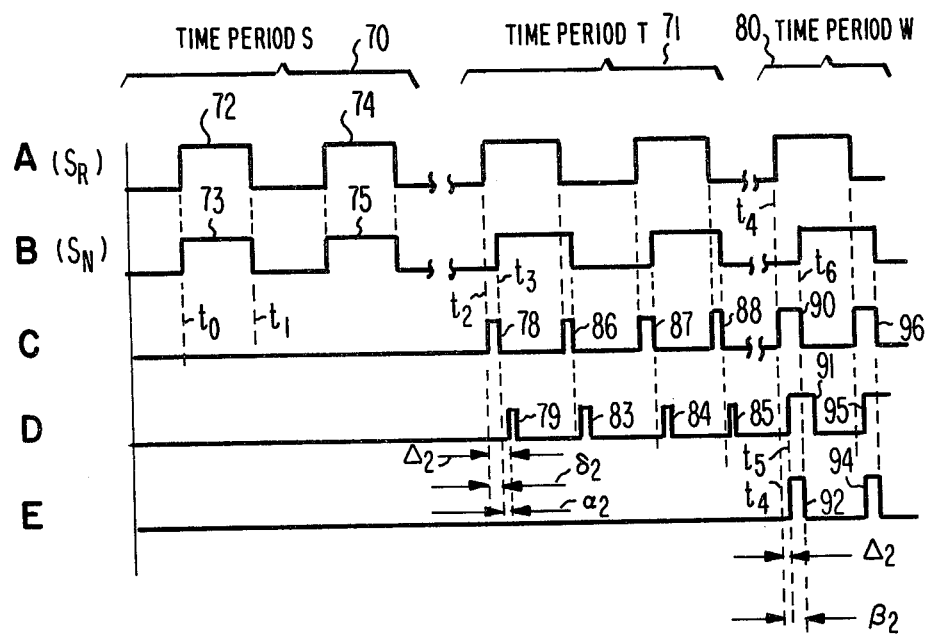
FIG. 3 is a set of waveforms illustrating the operation of the invention when the duty cycle of the two signals being phase locked are substantially the same.

In a second mode of operation of the invention as represented by the waveforms of FIG. 3 the duty cycles of the signals $S_N$ and $S_R$ have been assumed to be equal, each being 50%. It is to be understood however, that duty cycles of both signals could be, for example, 25% or 40%.

Referring now to the first mode of operation as represented by the waveforms of FIG. 2, the signal $S_R$, as shown in waveform 2A, is supplied to input 37 (see FIG. 1) of adjustable delay means 22 which has an adjustable delay time $\delta_1$. The output of delay means 22 is supplied to a first input 20 of XOR gate 36. The signal $S_N$, as shown in waveform 2C, is supplied directly to the other input 21 of XOR gate 36. Certain assumptions have been made with respect to signals $S_N$ and $S_R$. The first assumption, as mentioned above, is that the duty cycle of signal $S_R$ is 25% and that of signal $S_N$ is 50%. Furthermore, the leading edges of the two signals $S_R$ and $S_N$ are assumed to be in alignment under phase locked conditions, as shown at times $t_1$, $t_5$, $t_9$ and $t_{14}$ of the waveforms of FIG. 2. It is also assumed that the adjustable delay means 22 has been preset to have a delay $\delta_1$ such that the output thereof, as shown in waveform 2B, is centered with signal $S_N$ so that the time interval $t_1$-$t_2$ ($\delta_1$) is equal to the time interval $t_3$-$t_4$ ($\delta$) when the phase lock condition exists. The delay means 22 is thus seen to be equal to the time interval $t_1$-$t_2$ and $t_3$-$t_4$ so that the waveform of FIG. 2B is shifted a time interval $\delta$ with respect to the signal $S_R$ of waveform 2A.

In the waveforms of FIG. 2, the phase locked condition is assumed to exist during the time period X under bracket 37 and that out-of-phase condition is assumed to exist during the time period Y under bracket 38.

It is a well-known characteristic of an XOR gate that when signals of unequal levels are supplied to the two inputs thereof, the XOR gate 36 will output a high level output (a 1 level) and when input signals of the same level are supplied the XOR gate 36 will output a low level output (a 0 level). Thus, during the phase locked condition during time period X, the output of XOR gate 36 will be as shown in waveform 2D and will consist of the four pulses 40, 41, 42 and 43 all of which have the same widths. Such pulses are the result of the waveforms 2B and 2C being of different levels during certain time intervals.

More specifically, during time periods $t_5$-$t_6$ and $t_7$-$t_8$ the two pulses 42 and 43 are generated during the unequal level portions of pulses 45 and 46 of waveforms 2B and 2C, and during time periods $t_1$-$t_2$ and $t_3$-$t_4$ the pulses 40 and 41 are generated during the unequal level portions of pulses 38 and 39.

The output of XOR gate 36, which is represented by waveform 2D, is supplied directly to the input 27 of AND gate 28 and is supplied to the other input 25 of AND gate 28 through adjustable delay means 26, which has an adjustable delay time of $\Delta_1$, as represented by waveform 2E. It can be seen that the pulses of waveform 2E have been delayed by the time interval $\Delta_1$ which is greater than the width of any of the pulses 40–43 of waveform 2D by a time interval $\alpha_1$ and consequently, arrive at the input terminal 25 of AND gate 28 a time interval $\alpha_1$ after the termination of the pulse of waveforms 2D. Specifically, the time interval $\Delta_1$ is selected to be a time interval $\alpha_1$ greater than the width of the pulses 40–43 in order to avoid a race condition at the two inputs of AND gate 28. Thus, the leading edges of output pulses 50, 51, 52 and 53 from adjustable delay means 26 each occur a time interval $\alpha_1$ after the trailing edges of the four pulses 40, 41, 42 and 43 of waveform 2D. There is, therefore, no output from AND gate 28 during the time period X, as is shown in waveform 2F during the time period X.

Reference is now made to the performance of operation of the system during time period Y of FIG. 2 during which time period a disruption of the phase lock between signals $S_N$ and $S_R$ has occurred, as shown in waveforms 2B and 2C during time period Y. More specifically, the reference signal of waveform 2B has advanced with respect to the phase of signal $S_N$ so that the time interval $t_9$-$t_{10}$ is much less than the time interval $t_{11}$-$t_{13}$. The pulses 56 and 57 of waveform 2D at the output of XOR gate 36 of FIG. 1 are a direct result of unequal levels of the signals of waveforms 2B and 2C during the time intervals $t_9$-$t_{10}$ and $t_{11}$-$t_{13}$.

The pulse 54 waveform 2E is the delayed input pulse to AND gate from adjustable delay means 26 and can be seen to occur well after the termination of pulse 56 of waveform 2D which is supplied to the input 27 of AND gate 25. Therefore, no output from AND gate 28 occurs.

However, the pulse 55 of waveform 2E which is outputted from delay means 26 is seen to overlap the pulse 57 of waveform 2D which is supplied to the other input 27 of AND gate 28. Consequently, during the overlap period, time $t_{12}$-$t_{13}$, AND gate 28 outputs a pulse 69 as shown in waveform 2F. This pulse is supplied to a latch or flip-flop circuit 30 in FIG. 1 which responds thereto to supply a signal to alarm 32. The alarm 32 functions to alert an operator or some suitable corrective circuit in the system.

The generation of pulses 59 and 60 of waveform 2E and of pulse 61 of waveform 2F similarly are caused by the shift in phase of the waveforms 2B with respect to waveform 2C.

Referring now to the waveforms of FIG. 3, there is shown the aforementioned second mode of operation wherein the duty cycles of signal $S_R$ of waveform 3A and $S_N$ of waveform 3B have the same duty cycle. During time period S it is assumed that phase lock exists and that the leading edges of pulses 72 and 73 of waveforms 3A and 3B are coincident as well as the leading edges of pulses 74 and 75. Since the duty cycles are the same, the trailing edges of the pulses 72 and 73 and of 74 and 75 are also time coincident as shown in FIG. 3.

The signals $S_R$ and $S_N$ of waveforms 3A and 3B are supplied respectively, to the inputs of adjustable delay line 22 (FIG. 1) and the input 21 of XOR gate 36. However, since the duty cycles are the same, there is no need to delay the signal of waveform 3B with respect to the signal of waveform 3A. Accordingly, the adjustable delay line 22 is preset to a 0 time delay so that, in effect, $S_R$ is supplied directly to input 20 of XOR 36.

Since the two signals $S_N$ and $S_R$ supplied to the two inputs of XOR gate 36 are time coincident, there is no output from XOR gate since there is no time period in which the two input signals are of unequal levels. Since there is no output from XOR gate 36, the adjustable delay line 26 is not a part of the circuit and the inputs to the two inputs 25 and 7 of AND gate 28 are always both 0 level so that the output thereof is a 0 level and the latch 30 is never enabled.

However, during time period T, assume that the signal $S_N$ of waveform 3B is delayed with respect to signal $S_R$ of waveform 3A a time period $t_2$-$t_3$ so that for such time period $t_2$-$t_3$ the signal levels of $S_R$ and $S_N$ are unequal and XOR gate 36 outputs a pulse 78, as shown in waveform 3C. This pulse 78 is supplied directly to one input 27 of AND gate 28 and through delay means 26 to the other input 25 of AND gate 28. The delayed pulse is shown as a pulse 79 of waveform 3D and the leading edge can be seen to occur a time interval $\alpha_2$ after the trailing edge of pulse 78. Therefore, there is no time overlap between the two pulses 78 and 79 of FIG. 3 and consequently, no output from AND gate 28 so that the latch 39 remains inactivated.

It is to be noted that the time delay $\Delta_2$ of adjustable delay line 26 shown in the waveforms of FIG. 3 is not necessarily the same as the delay time $\Delta_1$ indicated in FIG. 2 of the waveforms of FIG. 2. Nor are the delay times $\delta_2$ and $\alpha_2$ of the waveforms of FIG. 3 necessarily the same time delays as $\delta_1$ and $\alpha_1$ of the waveforms of FIG. 2. It can be seen that both $\alpha_1$ and $\alpha_2$ are the differences between the associated time delays of $\Delta$ and $\delta$.

Similarly, pulses 83, 84, and 85 of waveform 3D occur completely after the pulses 86, 87 and 88 of waveform 3C so that there is no resulting output from AND gate 28.

Referring now to the time period W of FIG. 3, as indicated under the bracket 80 in FIG. 3, the signal $S_N$ has been delayed even more with respect to the reference signal $S_R$ of waveform 3A. Such phase lag is equal to the time interval $t_4$-$t_6$ and is designated as delay $\beta_2$. The delay $\beta_2$ is equal to the width of pulse 90 of waveform 3C. Pulse 90 is supplied directly to one input 27 of AND gate 28 and through delay means 26 to the other input 25 of AND gate 28. The delayed pulse is shown as pulse 91 in waveform 3D and can be seen to time overlap pulse 90 by time interval $t_5$-$t_6$. During this time interval $t_5$-$t_6$ an output pulse is outputted from AND gate 28 and is shown as pulse 92 in waveform 3E. Such a pulse 92 functions to enable latch 30 and consequently, also enables alarm 32.

In a similar manner, pulse 94 of waveform 3E is generated due to the time overlapping of pulses 95 and 96 of waveforms 3D and 3C.

It is to be understood that the time delay values of adjustable time delays 26 and 22 depend upon the particular parameters of a given circuit. In the case of a signal having different duty cycles the adjustable delay 22 is adjusted to center signal $S_R$ with signal $S_N$ and the required delay is dependent not only upon the frequency (the periods) of two signals but also upon the relative duty cycle values.

With respect to the adjustable delay means 26, the value $\Delta$, thereof is determined by the width of the pulses supplied from XOR gate 36 and the safety margin desired, i.e., the value the time delay between the trailing edge of the pulse supplied to input 27 of AND gate 28 and the leading edge of the pulse supplied to input 25 of AND gate 28. Such delay is designated as delay $\alpha_1$ in FIG. 2 and $\alpha_2$ in FIG. 3.

In the case of the mode of operation wherein the duty cycles of signals $S_R$ and $S_N$ are equal, the adjustable delay 22 is made equal to 0 for all conditions. The value of the time delay value of adjustable delay 26 again determines the margin of tolerance of phase difference desired and indicated by the time delay $\alpha_2$ in FIG. 3. It is apparent from an examination of the waveforms FIG. 3 during time period W that if $\alpha_2$ becomes less than the phase difference between signals $S_N$ and $S_R$ of waveforms 3A and 3B overlap will occur and the AND gate 28 of FIG. 1 will be energized to enable latch 30 and therefore, the alarm 32.

What is claimed is:

1. A system for detecting phase lock loss between first and second two level signals $S_N$ and $S_R$, of different ratios of high level portions to low level portions (duty cycles), and comprising:
    a single Exclusive OR (XOR) gate having first and second input terminals and an output terminal;
    means for supplying $S_N$ and $S_R$ to said first and second input terminals of said XOR gate so that the center points of the respective upper levels of $S_N$ and $S_R$ are aligned during phase lock;
    AND gate means having first and second input terminals and an output terminal;
    means for supplying output signals from said XOR gate to the first and second input terminals of said AND gate means with said output signals arriving at the first of said input terminals of said AND gate means a time interval $\Delta_1$ after the arrival of said output signals at the second of said input terminals of said AND gate means, where $\Delta_1$ is greater than the width of an output signal from said XOR gate when the center points of the upper levels of $S_N$ and $S_R$ are aligned; and
    means for detecting an output signal from said AND gate means when $\Delta_1$ is less than the width of an output signal from said XOR gate.

2. A system for detecting phase lock loss between first and second two level signals $S_N$ and $S_R$, where the duty cycles of the high level portions of $S_N$ and $S_R$ are different, and comprising:
    an Exclusive OR (XOR) gate having first and second input terminals and an output terminal;
    means for supplying $S_N$ and $S_R$ to said first and second inputs of said XOR gate with the center points of the upper levels being substantially aligned so that the time intervals between adjacent leading and trailing edges of $S_N$ and $S_R$ are both substantially equal to $\delta_1$ during a phase locked condition between $S_N$ and $S_R$;
    AND gate means having first and second input terminals and an output terminal;
    means for supplying the output signal of said XOR gate to the first and second input terminals of said AND gate means with said output signal arriving at a first of said input terminals of said AND gate means a time interval $\Delta_1$ after the arrival of said output signal at the second input terminal of said AND gate means; and
    means for detecting an output signal from said AND gate means.

3. In a phase locked loop system comprising signal generating means including a voltage-controlled oscillator (VCO) for generating a two level signal $S_N$ of frequency $f_N$ and having a first duty cycle ratio of high level portion to total cycle period $1/f_N$, means for generating a two level reference signal $S_R$ of frequency $f_R$ and having a second duty cycle ratio of high level portion to total cycle period $1/f_R$ different from said first duty cycle ratio, phase detector means responsive to $S_N$ and $S_R$ for generating a correcting signal $E_c$, said VCO responsive to $E_c$ to change its output frequency so that $f_N = f_R$ and with $S_N$ and $S_R$ being phase locked with a predetermined phase offset, a phase lock loss detecting circuit comprising:
    an Exclusive OR (XOR) gate having first and second input terminals and an output terminal for generating an output signal when the signal levels supplied to said input terminals are unequal;
    means including delay means for supplying $S_N$ and $S_R$ to said first and second inputs of said XOR gate so that the center points of the high level portions of $S_N$ and $S_R$ are nominally time aligned with any time difference $2\delta_1$ in the duty cycle ratios of $S_N$ and $S_R$ being substantially equally divided between the leading edges and the trailing edges of each half cycle of $S_N$ and $S_R$;
    AND gate means having first and second input terminals and an output terminal;
    means responsive to the output signal of said XOR gate to supply said output signal directly to the first input of said AND gate means and to said second input of said AND gate means delayed by a time interval greater than $\delta_1$; and
    means for detecting an output signal from said AND gate means to indicate loss of phase lock.

4. A method for detecting phase lock loss between two initially phase locked two level signals $S_N$ and $S_R$ having ratios of high level portions to low level portions which are different by a time interval $2\delta_1$ and comprising the steps of:
    aligning the centers of the high level portions of $S_N$ and $S_R$;
    XORing the aligned signals $S_N$ and $S_R$;
    delaying the XORed signal by an amount not less than $\delta_1$ which is the amount of phase shift that can occur between $S_N$ and $S_R$ before phase lock is lost;
    ANDing the XORed signal and the delayed XORed signal; and
    detecting the output of said ANDing step.

* * * * *